United States Patent
Lee

(10) Patent No.: US 11,901,027 B2
(45) Date of Patent: Feb. 13, 2024

(54) MEMORY SYSTEM INCLUDING A SUB-CONTROLLER AND OPERATING METHOD OF THE SUB-CONTROLLER

(71) Applicant: SK hynix Inc., Gyeonggi-do (KR)

(72) Inventor: Jong Joo Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 6 days.

(21) Appl. No.: 17/529,970

(22) Filed: Nov. 18, 2021

(65) Prior Publication Data

US 2022/0392559 A1 Dec. 8, 2022

(30) Foreign Application Priority Data

Jun. 7, 2021 (KR) .................. 10-2021-0073738

(51) Int. Cl.
*G11C 29/42* (2006.01)
*G11C 8/18* (2006.01)
*G11C 29/12* (2006.01)

(52) U.S. Cl.
CPC ............. *G11C 29/42* (2013.01); *G11C 8/18* (2013.01); *G11C 29/1201* (2013.01); *G11C 29/12015* (2013.01)

(58) Field of Classification Search
CPC ...................................................... G11C 29/42
USPC .................................................. 365/189.09
See application file for complete search history.

(56) References Cited

U.S. PATENT DOCUMENTS

| 2014/0185389 A1* | 7/2014 | Jeon | G11C 7/222 |
| | | | 365/189.05 |
| 2019/0079882 A1* | 3/2019 | Kim | G11C 29/52 |
| 2019/0139588 A1* | 5/2019 | Kim | G06F 12/0246 |
| 2019/0206478 A1* | 7/2019 | Jun | G11C 7/1048 |
| 2020/0050374 A1* | 2/2020 | Yoon | G06F 12/0246 |

FOREIGN PATENT DOCUMENTS

| KR | 10-2014-0088730 A | 7/2014 |
| KR | 10-2018-0092476 A | 8/2018 |
| KR | 10-2019-0097657 A | 8/2019 |

* cited by examiner

*Primary Examiner* — Muna A Techane
(74) *Attorney, Agent, or Firm* — IP & T GROUP LLP

(57) ABSTRACT

There are provided a memory system and an operating method of the memory system. The memory system includes: a main controller for transmitting main data having N bits through a main channel, where N is a positive integer; memory devices for storing sub-data constituting the main data, and transmitting the sub-data through sub-channels; and a sub-controller for communicating with the main controller through the main channel, and communicating with the memory devices through the sub-channels. The sub-controller generates the sub-data each having n bits where n is a positive integer less than N, by dividing the main data, generates sub-data strobe clocks by decreasing a frequency of a main data strobe clock synchronized with the main data, and transmits/receives the sub-data to/from the memory devices in synchronization with the sub-data strobe clocks.

20 Claims, 13 Drawing Sheets

MEMORY SYSTEM INCLUDING A SUB-CONTROLLER AND OPERATING METHOD OF THE SUB-CONTROLLER

CROSS-REFERENCE TO RELATED APPLICATION

The present application claims priority under 35 U.S.C. § 119(a) to Korean patent application number 10-2021-0073738, filed on Jun. 7, 2021, and which is incorporated herein by reference in its entirety.

BACKGROUND

Field of Invention

The present disclosure generally relates to a memory system including a sub-controller and an operating method of the sub-controller, and more particularly, to a memory system including a main controller and a sub-controller, and an operating method of the memory system.

Description of Related Art

A memory system is widely used to store data in various electronic devices such as computers, wireless communication devices, cameras, and digital displays. Data may be programmed in a plurality of memory cells included in the memory system, and be read from programmed memory cells.

A memory device in which data is stored in the memory system may be divided into various devices according to the structure and operating method thereof. For example, the memory device may include a magnetic hard disk, a Random Access Memory (RAM), a Read Only Memory (ROM), a Dynamic RAM (DRAM), a Synchronous Dynamic RAM (SDRAM), a Ferromagnetic RAM (FeRAM), a Magnetic RAM (MRAM), a Resistive RAM (RRAM), a flash memory, a Phase Change Memory (PCM), and the like. A nonvolatile memory such as a flash memory and a PCM may retain data even when the supply of external power is interrupted. In volatile memory devices such as a DRAM, data disappears when the supply of external power is interrupted. Therefore, a periodic refresh operation is required.

The amount of data processed in electronic devices is gradually increasing as the use of electronic devices increases. Therefore, a memory system including a plurality of memory devices has been used.

However, when a plurality of memory devices are simultaneously used, signal distortion may occur, and therefore, the processing speed of data may be lowered due to the signal distortion.

SUMMARY

Embodiments of the present disclosure provide a memory system capable of processing large-capacity data at high speed without signal distortion.

In accordance with an aspect of the present disclosure, there is provided a memory system including: a main controller configured to transmit main data having N bits through a main channel, where N is a positive integer; memory devices configured to store sub-data constituting the main data, and transmit the sub-data through sub-channels; and a sub-controller configured to communicate with the main controller through the main channel, and communicate with the memory devices through the sub-channels, wherein the sub-controller generates the sub-data each having n bits, where n is a positive integer less than N by dividing the main data, generates sub-data strobe clocks by decreasing a frequency of a main data strobe clock synchronized with the main data, and transmits/receives the sub-data to/from the memory devices in synchronization with the sub-data strobe clocks.

In accordance with another aspect of the present disclosure, there is provided a method for operating a sub-controller, the method including: receiving main data in synchronization with a main data strobe clock; generating a sub-data strobe clock by decreasing a frequency of the main data strobe clock; dividing the main data to generate sub-data; and outputting the sub-data in synchronization with the sub-data strobe clock.

In accordance with still another aspect of the present disclosure, there is provided a method for operating a sub-controller, the method including: receiving sub-data in synchronization with sub-data strobe clocks; generating a main data strobe clock having a frequency higher than that of the sub-data strobe clocks; generating main data by merging the sub-data; and outputting the main data in synchronization with the main data strobe clock.

In accordance with another aspect of the present disclosure, there is provided a system including: a master device configured to process a main data piece; J number of slave devices each configured to process a sub data piece; and an arbitrator device coupled to: exchange the main data piece with the master device at a main frequency through a main channel, exchange in parallel the J number of the sub data pieces with the slave devices at a sub frequency through respective sub channels, and perform conversion between the main data piece and the J number of the sub data pieces, wherein the main data piece is J times greater than the sub data piece, and wherein the main frequency is J times greater than the sub frequency.

BRIEF DESCRIPTION OF THE DRAWINGS

Various embodiments of the present disclosure will now be described more fully hereinafter with reference to the accompanying drawings; however, the embodiments may be embodied in different forms and should not be construed as limited to the embodiments set forth herein. Rather, these embodiments are provided so that this disclosure will be thorough and complete, and will fully convey the scope of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Figure 1:
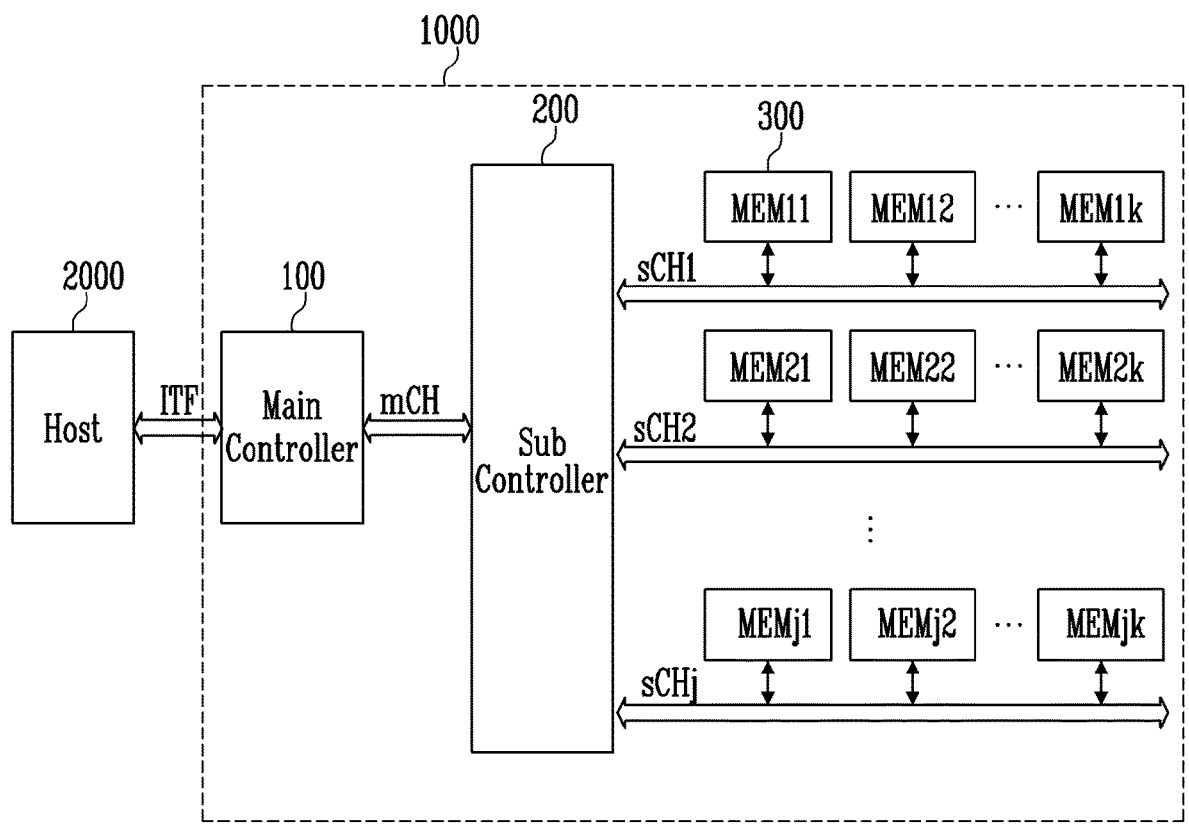
FIG. 1 is a diagram illustrating a memory system in accordance with an embodiment of the present disclosure.

FIG. 1 is a diagram illustrating a memory system in accordance with an embodiment of the present disclosure.

Referring to FIG. 1, the memory system 1000 may be configured to store data output from a host 2000 or output read data to the host 2000.

The memory system 1000 may include a main controller 100, a sub-controller 200, and eleventh to jkth memory devices MEM11 to MEMjk, where j and k are positive integers.

Each of the eleventh to jkth memory devices MEM11 to MEMjk may be implemented with a Random Access Memory (RAM), a Read Only Memory (ROM), a Dynamic RAM (DRAM), a Synchronous Dynamic RAM (SDRAM), a Ferromagnetic RAM (FeRAM), a Magnetic RAM (MRAM), a Resistive RAM (RRAM), a flash memory, a Phase Change Memory (PCM), and the like, which can store data.

The main controller 100 may be configured to communicate with the host 2000 through an interface ITF and communicate with the sub-controller 200 through a main channel mCH. For example, in a program operation, the main controller 100 may receive at least one of a request, a logical address, and data, which are output from the host 2000, through the interface ITF, convert the request into a command used in the memory system 1000, and convert the logical address into a physical address. The main controller 100 may transmit at least one of the command, the physical address, and data to the sub-controller 200 through the main channel mCH.

The sub-controller 200 may be configured to communicate with the main controller 100 through the main channel mCH and communicate with the eleventh to jkth memory devices MEM11 to MEMjk through first to jth sub-channels sCH1 to sCHj. For example, the sub-controller 200 may divide main data received through the main channel mCH into a plurality of sub-data according to the number of the first to jth sub-channels sCH1 to sCHj, and transmit sub-data to selected memory devices through the first to jth sub-channels sCH1 to sCHj. That is, an amount of sub-data transmitted to the selected memory device is smaller than that of the main data received through the main channel mCH, and therefore, the sub-controller 200 may decrease a burst length and a transmission speed of data loaded to the first to jth sub-channels sCH1 to sCHj as compared with those of data loaded to the main channel mCH. For example, in order to adjust a time when the main data is transmitted/received and a time when the sub-data is transmitted/received to be equal to each other, the sub-controller 200 may set a frequency of a data strobe clock when the sub-data is transmitted/received to be lower than that of the data strobe clock when the main data is transmitted/received. The sub-controller 200 may set a frequency of the data strobe clock to be in proportion to the number of the first to jth sub-channels sCH1 to sCHj, when the sub-data is transmitted/received. For example, when the number of the memory devices (e.g., the memory devices MEM11 to MEMj1 illustrated in FIG. 1) each coupled to a corresponding one of the first to jth sub-channels sCH1 to sCHj is 'J' or the number of the first to jth sub-channels sCH1 to sCHj is 'J', the main data piece may be J times greater than the sub data piece according to an embodiment. The main data may be divided into the J number of sub data pieces when modulating the main data to generate the sub data piece. The J number of sub data pieces may be merged into the main data when modulating the sub data pieces to generate the main data. Also, the main frequency may be J times greater than the sub frequency. The main frequency may be that of the main data strobe clock and the sub frequency may be that of the sub data strobe clock. The main data strobe clock may be utilized when the main data is transferred between the main controller 100 and the sub controller 200 through the main channel mCH. The sub data strobe clock may be utilized when the sub data piece is transferred between the sub controller 200 and each of the memory devices (e.g., the memory devices MEM11 to MEMj1) through a corresponding one of the first to jth sub-channels sCH1 to sCHj.

The host 2000 may be a main processor of various electronic devices such as a computer, a wireless communication device, a camera, and a digital display.

Figure 2:
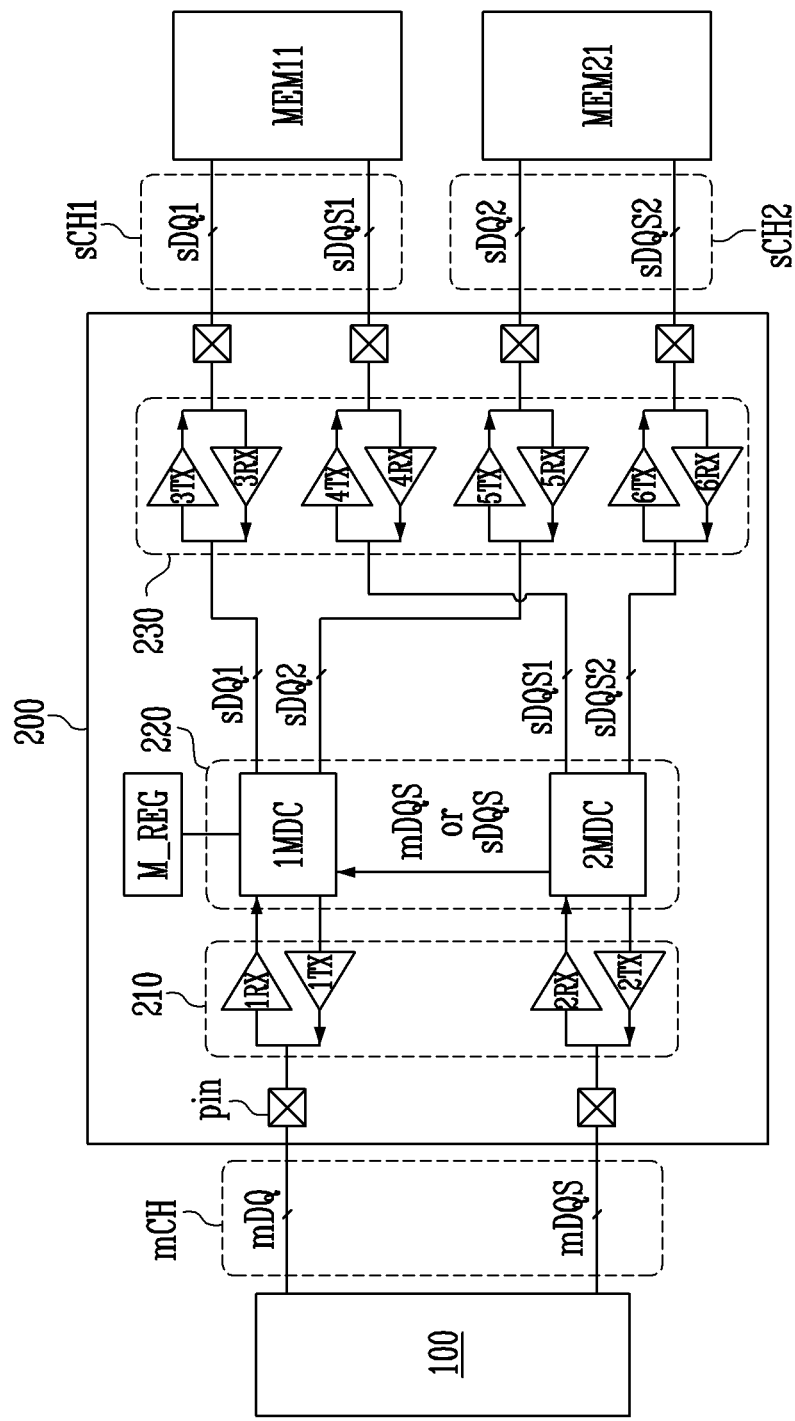
FIG. 2 is a diagram illustrating a sub-controller in accordance with an embodiment of the present disclosure.

FIG. 2 is a diagram illustrating a sub-controller in accordance with an embodiment of the present disclosure.

Referring to FIG. 2, the sub-controller 200 may be configured to communicate with the main controller 100 through the main channel mCH and communicate with memory devices MEM11 and MEM21 through sub-channels sCH1 and sCH2. Although the sub-controller 200 shown in FIG. 2 is connected to an eleventh memory device MEM11 through a first sub-channel sCH1 and is connected to a twenty-first memory device MEM2 through a second sub-channel sCH2, the number of sub-channels and memory devices, which are connected to the sub-controller 200, are not limited to those of the sub-channels and the memory devices, which are shown in FIG. 2.

The main channel mCH may include a plurality of lines configured to transmit main data mDQ and a main data strobe clock mDQS between the main controller 100 and the sub-controller 200. For example, the main channel mCH may include data lines configured to transmit the main data mDQ and clock lines configured to transmit the main data strobe clock mDQS. The data lines and the clock lines may be configured as lines physically different from each other. For example, the main data mDQ may be transmitted bit by bit in response to the main data strobe clock mDQS.

To improve the reliability of a data transmission operation, the sub-controller 200 may be configured to decrease signal distortion which may occur in the first and second sub-channels sCH1 and sCH2. The sub-controller 200 may be configured such that a burst length of the first and second sub-channels sCH1 and sCH2 decreases as compared with that of the main channel mCH. For example, when the first and second sub-channels sCH1 and sCH2 are connected to the sub-controller 200, the sub-controller 200 may divide an amount of data loaded to the main channel mCH by 2 which is the number of sub-channels, and communicate the divided data with the eleventh memory device MEM11 and the twenty-first memory device MEM21 respectively through the first sub-channel sCH1 and the second sub-channel sCH2. That is, when N sub-channels are connected to the sub-controller 200, where N is an integer greater than 1, and the burst length of the main channel mCH is 1, the burst length of each of the N sub-channels may be set to 1/N. In order to adjust the burst length as described above, the sub-controller 200 may be configured as follows.

The sub-controller 200 may include a main input/output circuit group 210, a modulation circuit group 220, and a sub-input/output circuit group 230.

The main input/output circuit group 210 may be configured to input or output the main data mDQ and the main data strobe clock mDQS between the main channel mCH and the modulation circuit group 220. For example, the main input/output circuit group 210 may include a first input driver 1RX and a first output driver 1TX, which are configured to input or output the main data mDQ, and a second input driver 2RX and a second output driver 2TX, which are configured to input or output the main data strobe clock mDQS. For example, the first input driver IRX and the first output driver 1TX may be connected to the data lines which transmit the main data mDQ through a pin, and the second input driver 2RX and the second output driver 2TX may be connected to the clock lines which transmit the main data strobe clock mDQS through a pin. For example, the first input driver 1RX may be configured to transmit the main data mDQ received through the pin to the modulation circuit group 220, and the first output driver 1TX may be configured to output the main data mDQ transmitted from the modulation circuit group 220 through the pin. For example, the second input driver 2RX may be configured to transmit the main data strobe clock mDQS received through the pin to the modulation circuit group 220, and the second output driver 2TX may be configured to output the main data strobe clock mDQs transmitted from the modulation circuit group 220 through the pin.

The modulation circuit group 220 may be configured to modulate data and clocks. For example, the modulation circuit group 220 may include a first modulation circuit 1MDC configured to modulate the data and a second modulation circuit 2MDC configured to modulate the clocks.

The first modulation circuit 1MDC may be configured to divide the main data mDQ into first and second sub-data sDQ1 and sDQ2 and then output the first and second sub-data sDQ1 and sDQ2, or merge the first and second sub-data sDQ1 and sDQ2 into the main data mDQ and then output the main data mDQ. For example, the first modulation circuit 1MDC may generate first sub-data sDQ1 by grouping some of the main data mDQ transmitted from the first input driver 1RX, generate second sub-data sDQ2 by grouping the other of the main data mDQ, and output the first and second sub-data sDQ1 and sDQ2 respectively through output lines. The first modulation circuit 1MDC may modulate a bit number of the first and second sub-data sDQ1 and sDQ2 according to a number of sub-channels connected to the sub-controller 200. For example, the first modulation 1MDC may store information on the number of sub-channels, and adjust a bit number of data included in each of the first and second sub-data sDQ1 and sDQ2 according to the information on the number of sub-channels.

The second modulation circuit 2MDC may be configured to divide the main data strobe clock mDQS into first and second sub-data strobe clocks sDQS1 and sDQS2 and then output the first and second sub-data strobe clocks sDQS1 and sDQS2, or merge the first and second sub-data strobe clocks sDQS1 and sDQS2 into the main data strobe clock mDQS and then output the main data strobe clock mDQS. For example, the second modulation circuit 2MDC may generate the first and second sub-data strobe clocks sDQS1 and sDQS2 by decreasing a frequency of the main data strobe clock mDQS transmitted from the second input driver 2RX, and output the first and second sub-data strobe clocks sDQS1 and sDQS2 respectively through output lines. The second modulation circuit 2MDC may modulate a frequency of the first and second sub-data strobe clocks sDQS1 and sDQS2 according to the number of sub-channels connected to the sub-controller 200. For example, the second modulation circuit 2MDC may store information on the number of sub-channels, and adjust the frequency of the first and second sub-data strobe clocks sDQS1 and sDQS2 according to the information on the number of sub-channels. The second sub-data strobe clock sDQS2 is output through an output line different from that of the first sub-data strobe clock sDQS1, but may be set to have the same frequency and the same output time as the first sub-data strobe clock sDQS1. That is, the first and second sub-data strobe clocks sDQS1 and sDQS2 may be the same.

The second modulation circuit 2MDC may transmit the main strobe clock mDQS or a sub-data strobe clock sDQS to the first modulation circuit 1MDC. The sub-data strobe clock sDQS may be the first or second sub-data strobe clock sDQS1 or sDQS2.

A program operation will be described as an example. The second modulation circuit 2MDC may generate the first and second sub-data strobe clocks sDQS1 and sDQS2 by modulating the frequency of the main data strobe clock mDQS, and transmit the first or second sub-data strobe clock sDQS1 or sDQS2 as the sub-data strobe clock sDQS to the first modulation circuit 1MDC. The first modulation circuit 1MDC may output the first or second sub-data sDQ1 or sDQ2 in response to the sub-data strobe clock sDQS.

A read operation will be described as an example. The second modulation circuit 2MDC may generate the main data strobe clock mDQS by modulating the frequency of the first or second sub-data strobe clock sDQS1 or sDQS2, and transmit the main data strobe clock mDQS to the first modulation circuit 1MDC. The first modulation circuit 1MDC may output the main data mDQ in response to the main data strobe clock mDQS.

The sub-input/output circuit group 230 may be configured to input or output the first and second sub-data sDQ1 and sDQ2 and the first and second sub-data strobe clocks sDQS1 and sDQS2 between the first and second sub-channels sCH1 and sCH2 and the modulation circuit group 220. For example, the sub-input/output circuit group 230 may include third to sixth output drivers 3TX to 6TX and third to sixth input drivers 3RX to 6RX. The third output driver 3TX may be configured to output the first sub-data sDQ1 output from the first modulation circuit 1MDC to the first sub-channel sCH1 through a pin, and the third input driver 3RX may be configured to transmit the first sub-data sDQ1 input through the pin to the first modulation circuit IMDC.

The fourth output driver 4TX may be configured to output the first sub-data strobe clock sDQS1 output from the second modulation circuit 2MDC to the first sub-channel sCH1 through a pin, and the fourth input driver 4RX may be configured to transmit the first sub-data strobe clock sDQS1 input through the pin to the second modulation circuit 2DMC.

The fifth output driver 5TX may be configured to output the second sub-data sDQ2 output from the first modulation circuit 1MDC to the second sub-channel sCH2 through a pin, and the fifth input driver 5RX may be configured to transmit the second sub-data sDQ2 input through the pin to the first modulation circuit 1MDC.

The sixth output driver 6TX may be configured to output the second sub-data strobe clock sDQS2 output from the second modulation circuit 2MDC to the second sub-channel sCH2 through a pin, and the sixth input driver 6RX may be configured to transmit the second sub-data strobe cock sDQS2 input through the pin to the second modulation circuit 2MDC.

The first sub-data sDQ1 loaded to the first sub-channel sCH1 may be transmitted to the eleventh memory device MEM11 or the third input driver 3RX in synchronization with the first sub-data strobe clock sDQS1 loaded to the first sub-channel sCH1. Since the sub-channel is configured with two sub-channels corresponding to the first and second sub-channels sCH1 and sCH2, the first sub-data sDQ1 may be configured as data of N/2 bits, when the main data mDQ is configured as data of N bits. When the frequency of the main data strobe clock mDQS is M, where M is a positive rational number, the frequency of the first sub-data strobe clock sDQS1 may be decreased as M/2.

The second sub-data sDQ2 loaded to the second sub-channel sCH2 may be transmitted to the twenty-first memory device MEM21 or the fifth input driver 5RX in synchronization with the second sub-data strobe clock sDQS2 loaded to the second sub-channel sCH2. Since the sub-channel is configured with two sub-channels corresponding to the first and second sub-channels sCH1 and sCH2, the second sub-data sDQ2 may be configured as data of N/2 bits, when the main data mDQ is configured as data of N bits. When the frequency of the main data strobe clock mDQS is M, the frequency of the second sub-data strobe clock sDQS2 may be decreased as M/2.

Since the first and second sub-data strobe clocks sDQS1 and sDQS2 have the same frequency and are simultaneously output from the fourth and sixth output drivers 4TX and 6TX, the first and second sub-data sDQ1 and sDQ2 may also be simultaneously transmitted to the eleventh and twenty-first memory devices MEM11 and MEM21 or the third and fifth input drivers 3RX and 5RX.

That is, a time required to transmit the first sub-data sDQ1 through the first sub-channel sCH1, a time required to transmit the second sub-data sDQ2 through the second sub-channel sCH2, and a time required to transmit the main data mDQ through the main channel mCH are the same.

Thus, the first and second sub-data sDQ1 and sDQ2 obtained by distributing the main data mDQ are transmitted through different first and second sub-channels sCH1 and sCH2 in synchronization with sub-data strobe clocks having a low frequency, and hence signal distortion which may occur in a process in which sub-data is transmitted through the first and second sub-channels sCH1 and sCH2 can be reduced. Accordingly, the reliability of a transmission operation in the memory system can be improved even when the amount of the main data mDQ increases.

In addition to the above-described components, the sub-controller 200 may include a mode register M_REG. Mode information of the eleventh and twenty-first memory devices MEM11 and MEM21 connected to the sub-controller 200 may be stored in the mode register M_REG. For example, the mode information may be information on whether the eleventh and twenty-first memory devices MEM11 and MEM21 are double data rate (DDR) memory devices, low power DDR (LPDDR) memory devices, LPDDR3 memory devices, or LPDDR4 memory devices. The mode register M_REG may be connected to the first modulation circuit 1MDC, and the first modulation circuit 1MDC may modulate data and clocks to be suitable for standards of a clock, a data transmission speed, a bandwidth, and a voltage according to the mode information stored in the mode register M_REG.

An operation of the above-described sub-controller 200 will be described as follows.

Figure 3:
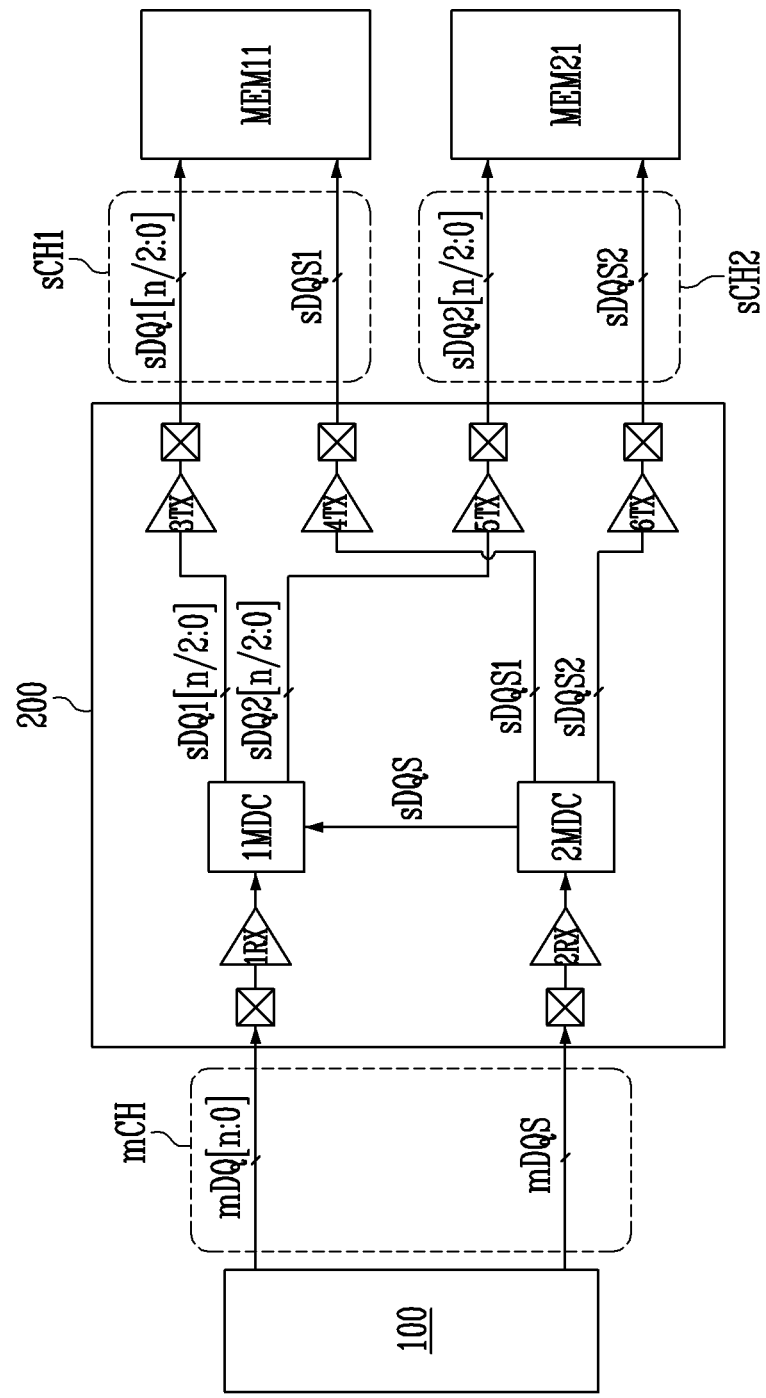
FIG. 3 is a diagram illustrating a program operation using the sub-controller in accordance with an embodiment of the present disclosure.

FIG. 3 is a diagram illustrating a program operation using the sub-controller in accordance with an embodiment of the present disclosure.

Referring to FIG. 3, in the program operation, the sub-controller 200 may receive a main data strobe clock mDQS output from the main controller 100 through the main channel mCH, and output first and second sub-data strobe clocks sDQS1 and sDQS2 generated by modulating a frequency of the main data strobe clock mDQS through the first and second sub-channels sCH1 and sCH2.

The sub-controller 200 may receive main data mDQ[n:0] where n is a positive integer, output from the main controller 100, and transmit first and second sub-data sDQ1[$n$/2:0] and sDQ2[$n$/2:0] generated by modulating the main data mDQ [n:0] respectively to the eleventh and twenty-first memory devices MEM11 and MEM21 through the first and second sub-channels sCH1 and sCH2 in synchronization with the first and second sub-data strobe clocks sDQS1 and sDQS2.

For example, when the main data strobe clock mDQS is input having a frequency of M where M is a positive integer, the second input driver 2RX may transmit the input main data strobe clock mDQS to the second modulation circuit 2MDC. The second modulation circuit 2MDC may generate a plurality of sub-data strobe clocks having a frequency lower than M according to information on a number of sub-channels. A case where the number of sub-channels is 2 will be described as an example. The second modulation circuit 2MDC may generate a first sub-data strobe clock sDQS1 and a second sub-data strobe clock sDQS2, which have a frequency of M/2 by dividing the frequency of the main data strobe clock mDQS by 2.

The second modulation circuit 2MDC may transmit, to the first modulation circuit 1MDC, a sub-data strobe clock sDQS having the same frequency as the first and second sub-data strobe clocks sDQS1 and sDQS2.

The first modulation circuit 1MDC may transmit the first sub-data sDQ1[$n$/2:0] to the third output driver 3TX and transmit the second sub-data sDQ2[$n$/2:0] to the fifth output driver 5TX, in response to the sub-data strobe clock sDQS.

The first sub-data strobe clock sDQS1 generated in the second modulation circuit 2MDC may be transmitted to the fourth output driver 4TX, and the second sub-data strobe clock sDQS2 may be transmitted to the sixth output driver 6TX.

When the fourth output driver 4TX outputs the first sub-data strobe clock sDQS1 through the first sub-channel sCH1, the third output driver 3TX may transmit the first sub-data sDQ1[$n$/2:0] to the eleventh memory device MEM11 in synchronization with the first sub-data strobe clock sDQS1.

When the sixth output driver 6TX outputs the second sub-data strobe clock sDQS2 through the second sub-channel sCH2, the fifth output driver 5TX may transmit the second sub-data sDQ2[$n$/2:0] to the twenty-first memory device MEM21 in synchronization with the second sub-data strobe clock sDQS2.

The data and the clocks, which are described with reference to FIG. 3, will be described in more detail as follows.

Figure 4:
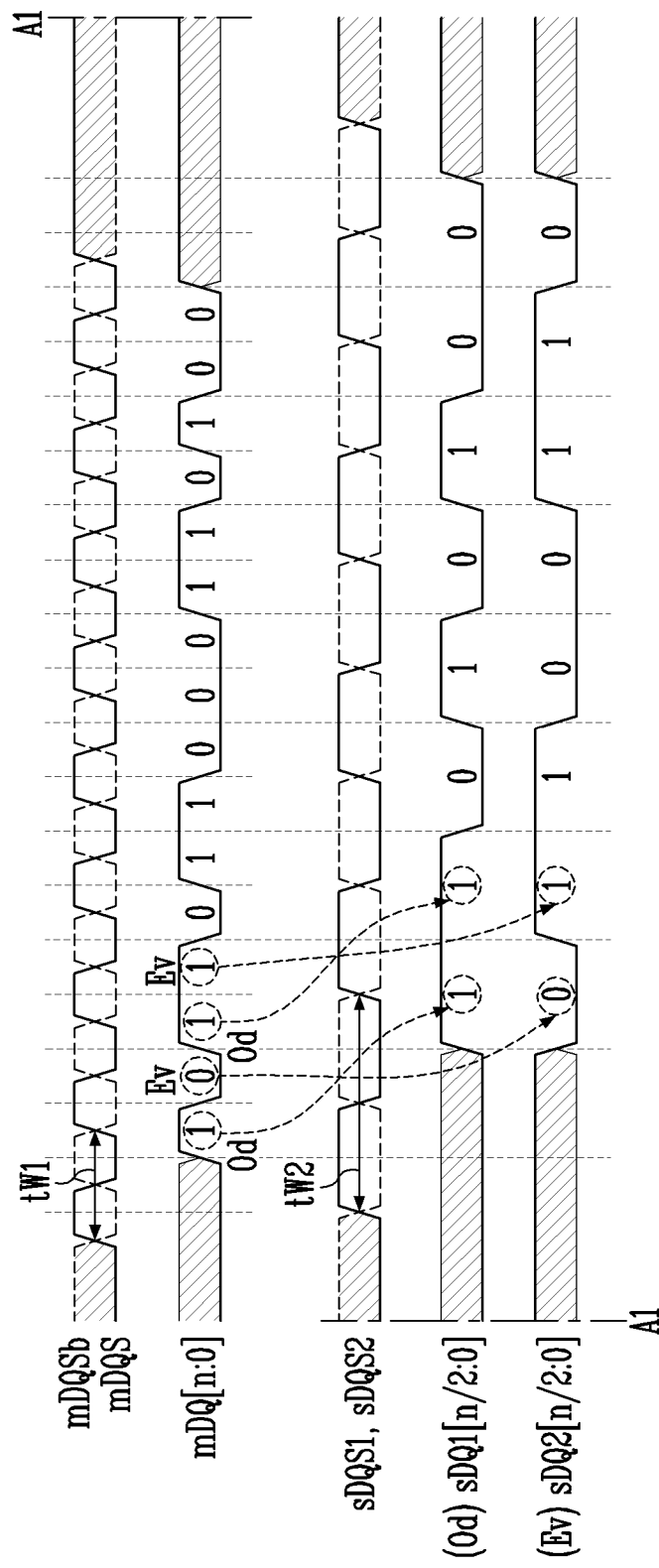
FIG. 4 is a diagram illustrating data and clocks, which are modulated in the program operation in accordance with an embodiment of the present disclosure.

FIG. 4 is a diagram illustrating data and clocks, which are modulated in the program operation in accordance with an embodiment of the present disclosure.

Referring to FIGS. 3 and 4, a time required in one cycle of the main data strobe clock mDQS is a first time tW1. Although a case where the main data strobe clock mDQS is input through the main channel mCH has been illustrated in FIG. 3, a main data strobe inverted clock mDQSb may be simultaneously input with the main data strobe clock mDQS through another line of the main channel mCH.

The main data mDQ[n:0] may be input to the first modulation circuit 1MDC in response to the main data strobe clock mDQS. For example, the main data mDQ[n:0] of 16 bits, i.e., '1011011000110100' may be sequentially input to the first modulation circuit 1MDC in synchronization with the main data strobe clock mDQS.

When the main data mDQ[n:0] are all input to the first modulation circuit 1MDC (A1), the second modulation circuit 2MDC may output the first and second sub-data strobe clocks sDQS1 and sDQS2 having a frequency of M/2. A speed of the first and second sub-data strobe clocks sDQS1 and sDQS2 is slower by ½ than that of the main data strobe clock mDQS, and therefore, a time required in one cycle of the first and second sub-data strobe clocks sDQS1 and sDQS2 may be a second time tW2 longer than the first time tW1. That is, a time required in two cycles of the main data strobe clock mDQS may be equal to that required in one cycle of the first and second sub-data strobe clocks sDQS1 and sDQS2.

The first modulation circuit 1MDC may generate the first sub-data sDQ1[n/2:0] by extracting odd-numbered bits Od from a plurality of bits included in the main data mDQ[n:0], and generate the second sub-data sDQ2[n/2:0] by extracting even-numbered bits Ev from the plurality of bits included in the main data mDQ[n:0]. That is, all of the bits of the main data mDQ[n:0] may be classified into first and second sub-data sDQ1[n/2:0] and sDQ2[n/2:0]. For example, the first sub-data sDQ1[n/2:0] may include '11010100' corresponding to the odd-numbered bits Od of the main data mDQ[n:0], and the second sub-data sDQ2[n/2:0] may include '01100110' corresponding to the even-numbered bits Ev of the main data mDQ[n:0]. That is, each of the first and second sub-data sDQ1[n/2:0] and sDQ2[n/2:0] may be configured with 8 bits.

The first sub-data sDQ1[n/2:0] may be transmitted to the eleventh memory device MEM11 through the first sub-channel sCH in synchronization with the first sub-data strobe clock sDQS1, and the second sub-data sDQ2[n/2:0] may be transmitted to the twenty-first memory device MEM21 through the second sub-channel sCH2 in synchronization with the second sub-data strobe clock sDQS2.

Figure 5:
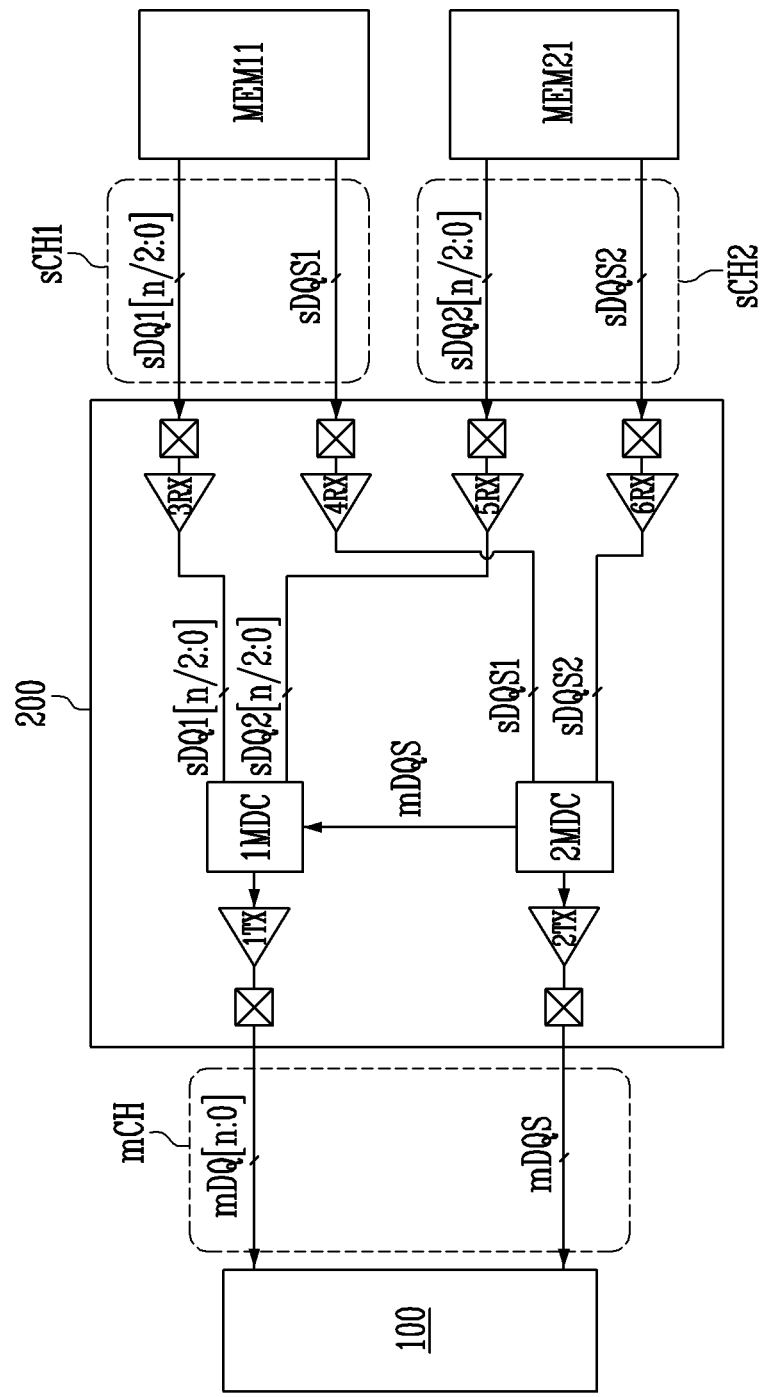
FIG. 5 is a diagram illustrating a read operation using the sub-controller in accordance with an embodiment of the present disclosure.

FIG. 5 is a diagram illustrating a read operation using the sub-controller in accordance with an embodiment of the present disclosure.

Referring to FIG. 5, in the read operation, the sub-controller 200 may receive first and second sub-data strobe clocks sDQS1 and sDQS2 output from the eleventh and twenty-first memory devices MEM11 and MEM21 through the first and second sub-channels sCH1 and sCH2, and output, to the main controller 100, a main data strobe clock mDQS generated by modulating the frequency of the first and second sub-data strobe clocks sDQS1 and sDQS2 through the main channel mCH.

The sub-controller 200 may receive first and second sub-data sDQ1[n/2:0] and sDQ2[n/2:0] output from the eleventh and twenty-first memory devices MEM11 and MEM21 through the first and second sub-channels sCH1 and sCH2, generate main data mDQ[n:0] by merging the first and second sub-data sDQ1[n/2:0] and sDQ2[n/2:0], and output the main data mDQ[n:0] to the main controller 100 through the main channel mCH.

For example, when the first sub-data strobe clock sDQS1 having a frequency of M/2 is input where M is a positive integer, the fourth input driver 4RX may transmit the first sub-data strobe clock sDQS1 to the second modulation circuit 2MDC. When the second sub-data strobe clock sDQS2 having a frequency of M/2 is input, the sixth input driver 6RX may transmit the second sub-data strobe clock sDQS2 to the second modulation circuit 2MDC.

The second modulation circuit 2MDC may generate the main data strobe clock mDQS having a frequency higher than M/2 according to information on a number of sub-channels. A case where the number of sub-channels is 2 will be described as an example. The second modulation circuit 2MDC may generate the main data strobe clock mDQS having a frequency of M by multiplying M/2 as the frequency of the first and second sub-data strobe clocks sDQS1 and sDQS2 by 2.

The third input driver 3RX may receive first sub-data sDQ1[n/2:0] output from the eleventh memory device MEM11, and transmit the received first sub-data sDQ1[n/2:0] to the first modulation circuit 1MDC.

The fifth input driver 5RX may receive second sub-data sDQ2[n/2:0] output from the twenty-first memory device MEM21, and transmit the received second sub-data sDQ2[n/2:0] to the first modulation circuit 1MDC.

The first modulation circuit 1MDC may generate the main data mDQ[n:0] by sequentially merging, bit by bit, the first and second sub-data sDQ1[n/2:0] and sDQ2[n/2:0], and output the main data mDQ[n:0] to the main channel mCH in synchronization with the main data strobe clock mDQS output from the second modulation circuit 2MDC.

When the second modulation circuit 2MDC outputs the main data strobe clock mDQS to the first modulation circuit 1MDC, the second modulation circuit 2MDC may also output the main data strobe clock mDQS to the main channel mCH. Therefore, the main data mDQ loaded to the main channel mCH may be input to the main controller 100 in synchronization with the main data strobe clock mDQS.

The data and the clocks, which are described with reference to FIG. 5, will be described in more detail as follows.

Figure 6:
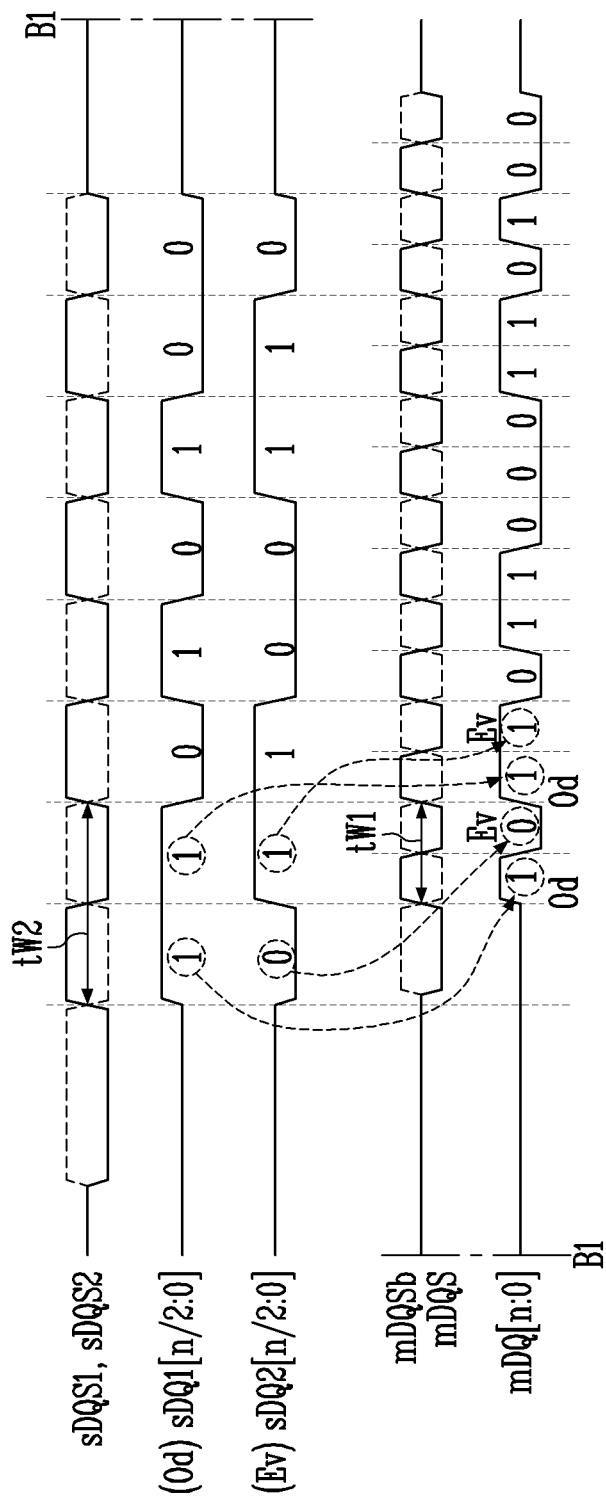
FIG. 6 is a diagram illustrating data and clocks, which are modulated in the read operation in accordance with an embodiment of the present disclosure.

FIG. 6 is a diagram illustrating data and clocks, which are modulated in the read operation in accordance with an embodiment of the present disclosure.

Referring to FIGS. 5 and 6, a time required in one cycle of the first and second sub-data strobe clocks sDQS1 and sDQS2 is a second time tW2. The first and second sub-data sDQ1[n/2:0] and sDQ2[n/2:0] may be input to the first modulation circuit 1MDC in response to the first and second sub-data strobe clocks sDQS1 and sDQS2. For example, the first sub-data sDQ1[n/2:0] of 8 bits, i.e., '11010100' and the second sub-data sDQ2[n/2:0] of 8 bits, i.e., '01100110' may be sequentially input to the first modulation circuit 1MDC in synchronization with the first and second sub-data strobe clocks sDQS1 and sDQS2.

When both of the first and second sub-data sDQ1[n/2:0] and sDQ2[n/2:0] are input to the first modulation circuit 1MDC (B1), the second modulation circuit 2MDC may output the main data strobe clock mDQS having a frequency of M. A speed of the main data strobe clock mDQS is faster by two times than that of the first and second sub-data strobe clocks sDQS1 and sDQS2, and therefore, a time required in one cycle of the main data strobe clock mDQS may be a first time tW1 shorter than the second time tW2. That is, the time required in one cycle of the first and second sub-data strobe clocks sDQS1 and sDQS2 may be equal to that required in two cycles of the main data strobe clock mDQS.

The first modulation circuit 1MDC may generate main data mDQ[n:0] by sequentially merging a plurality of bits included in the first and second sub-data sDQ1[$n/2$:0] and sDQ2[$n/2$:0]. That is, the main data mDQ may be generated as both the first and second sub-data sDQ1[$n/2$:0] and sDQ2[$n/2$:0] are merged. For example, the main data mDQ [n:0] configured with 16 bits, i.e., '1011011000110100' may be generated as the first and second sub-data sDQ1[$n/2$:0] and sDQ2[$n/2$:0], each of which is configured with 8 bits are merged.

The main data mDQ[n:0] may be transmitted to the main controller 100 through the main channel mCH in synchronization with the main data strobe clock mDQS.

Figure 7:
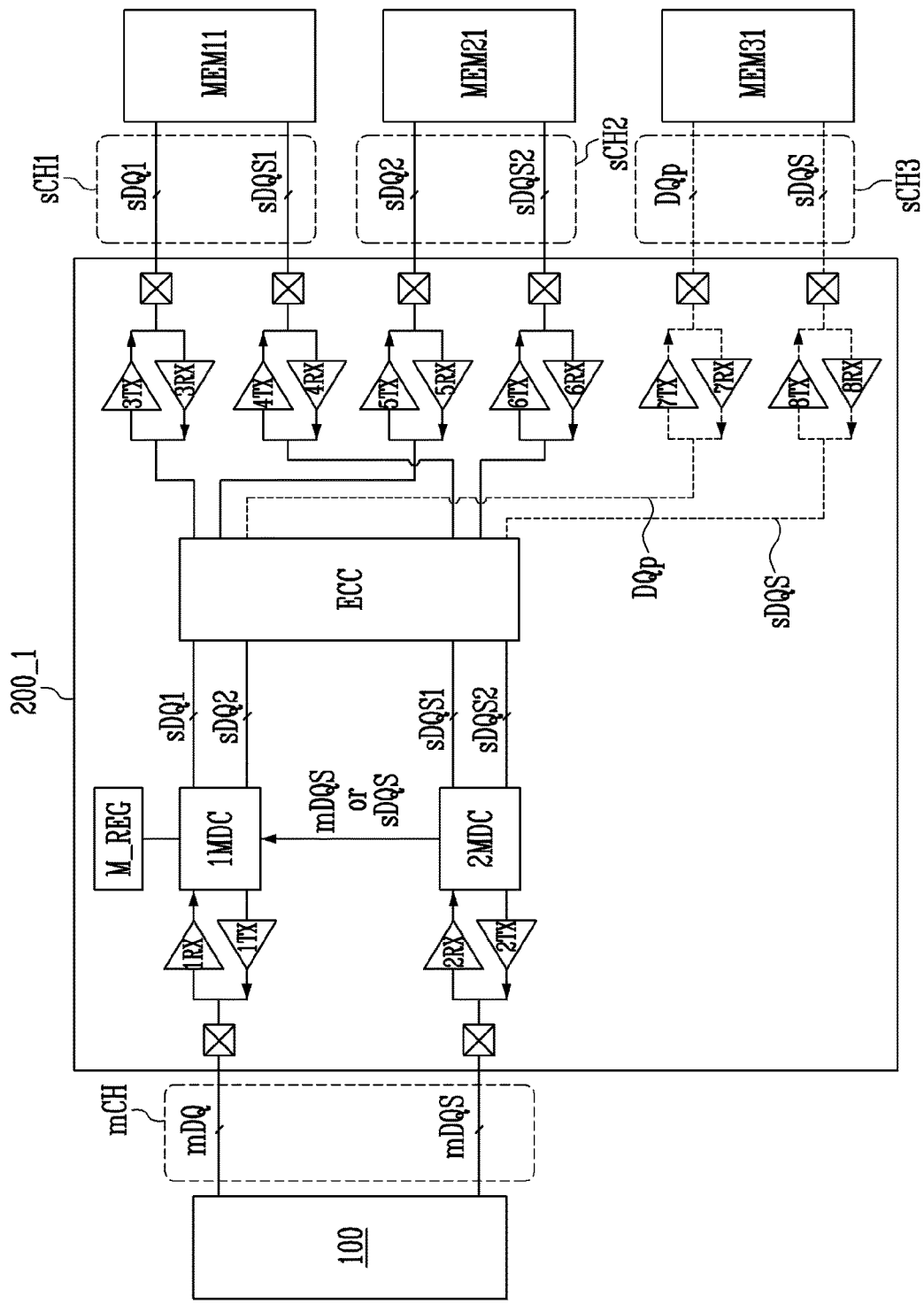
FIG. 7 is a diagram illustrating a sub-controller in accordance with another embodiment of the present disclosure.

FIG. 7 is a diagram illustrating a sub-controller in accordance with another embodiment of the present disclosure.

Referring to FIG. 7, the sub-controller 200_1 may further include an error correction circuit ECC, seventh and eighth output drivers 7TX and 8TX, and seventh and eighth input drivers 7RX and 8RX.

The error correction circuit ECC may generate parity data DQp about the first and second sub-data sDQ1 and sDQ2 in a program operation, and detect and correct an error of the first and second sub-data sDQ1 and sDQ2 by using the parity data DQp.

Various methods using a hamming code, a low density parity check (LDPC), or the like may be performed as a method for generating parity data DQp and detecting and correcting an error of data, using the parity data DQp. In addition, various methods for error correction have been published, and therefore, a detailed description of a method for generating parity data DQp and using the parity data DQp will be omitted in this embodiment.

In the program operation, the error correction circuit ECC may receive first and second sub-data sDQ1 and sDQ2 from the first modulation circuit 1MDC, and generate parity data DQp about the received first and second sub-data sDQ1 and sDQ2. When the parity data DQp is generated, the error correction circuit ECC may transmit the first sub-data sDQ1 to the third output driver 3TX, transmit the second sub-data sDQ2 to the fifth output driver 5TX, and transmit the parity data DQp to the seventh output driver 7TX. The error correction circuit ECC may receive first and second sub-data strobe clocks sDQS1 and sDQS2 from the second modulation circuit 2MDC, transmit the first sub-data strobe clock sDQS1 to the fourth output driver 4TX, transmit the second sub-data strobe clock sDQS2 to the sixth output driver 6TX, and transmit a sub-data strobe clock sDQS to the eighth output driver 8TX. The sub-data strobe clock sDQS may be the first or second sub-data strobe clock sDQS1 or sDQS2.

The parity data DQp may be transmitted to a thirty-first memory device MEM31 connected to a third sub-channel sCH3, which is different from the eleventh and twenty-first memory devices MEM11 and MEM21. For example, the seventh output driver 7TX may transmit the parity data DQp to the thirty-first memory device MEM31 through the third sub-channel sCH3, and the eighth output driver 8TX may transmit the sub-data strobe clock sDQS to the thirty-first memory device MEM31 through the third sub-channel sCH3.

In the above-described embodiments, information on a number of sub-channels is stored in the first and second modulation circuits 1MDC and 2MDC, and a bit number of the first and second sub-data sDQ1 and sDQ2 and a frequency of the first and second sub-data strobe clocks sDQS1 and sDQS2 are determined according to the information on the number of sub-channels. However, the third sub-channel sCH3 connected to the thirty-first memory device MEM31 for storing the parity data DQp is not included in the information on the number of sub-channels.

In a read operation, the error correction circuit ECC may receive the first and second sub-data sDQ1 and sDQ2 from the eleventh and twenty-first memory devices MEM11 and MEM21, and receive the parity data DQp from the thirty-first memory device MEM31. The error correction circuit ECC may detect and correct an error of the first and second sub-data sDQ1 and sDQ2 by using the parity data DQp, and transmit final first and second sub-data sDQ1 and sDQ2 to the first modulation circuit 1MDC. Also, the error correction circuit ECC may receive first and second sub-data strobe clocks sDQS1 and sDQS2, and transmit the received first and second sub-data strobe clocks sDQS1 and sDQS2 to the second modulation circuit 2MDC.

Figure 8:
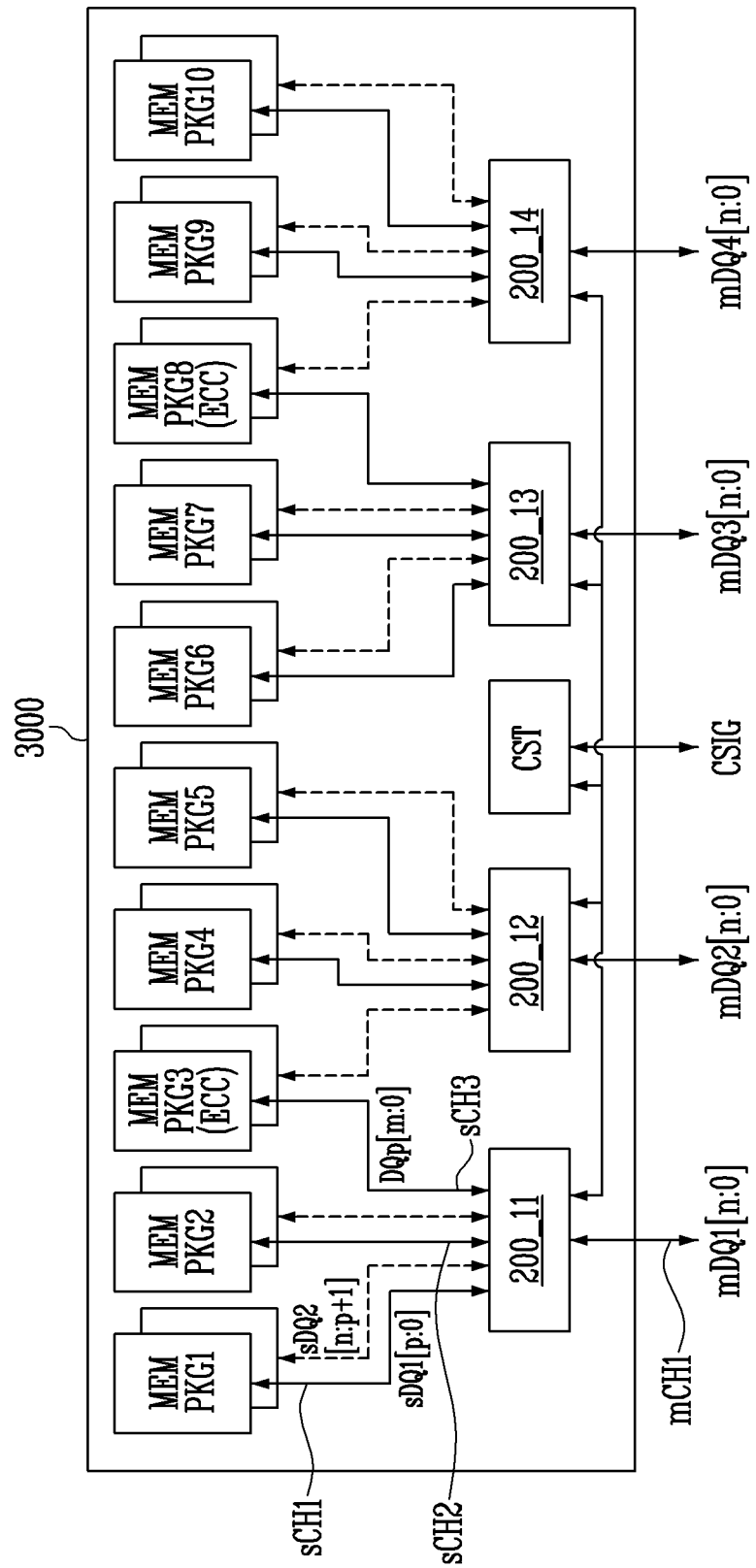
FIGS. 8 and 9 are diagrams illustrating memory systems in accordance with other embodiments of the present disclosure.
Figure 9:
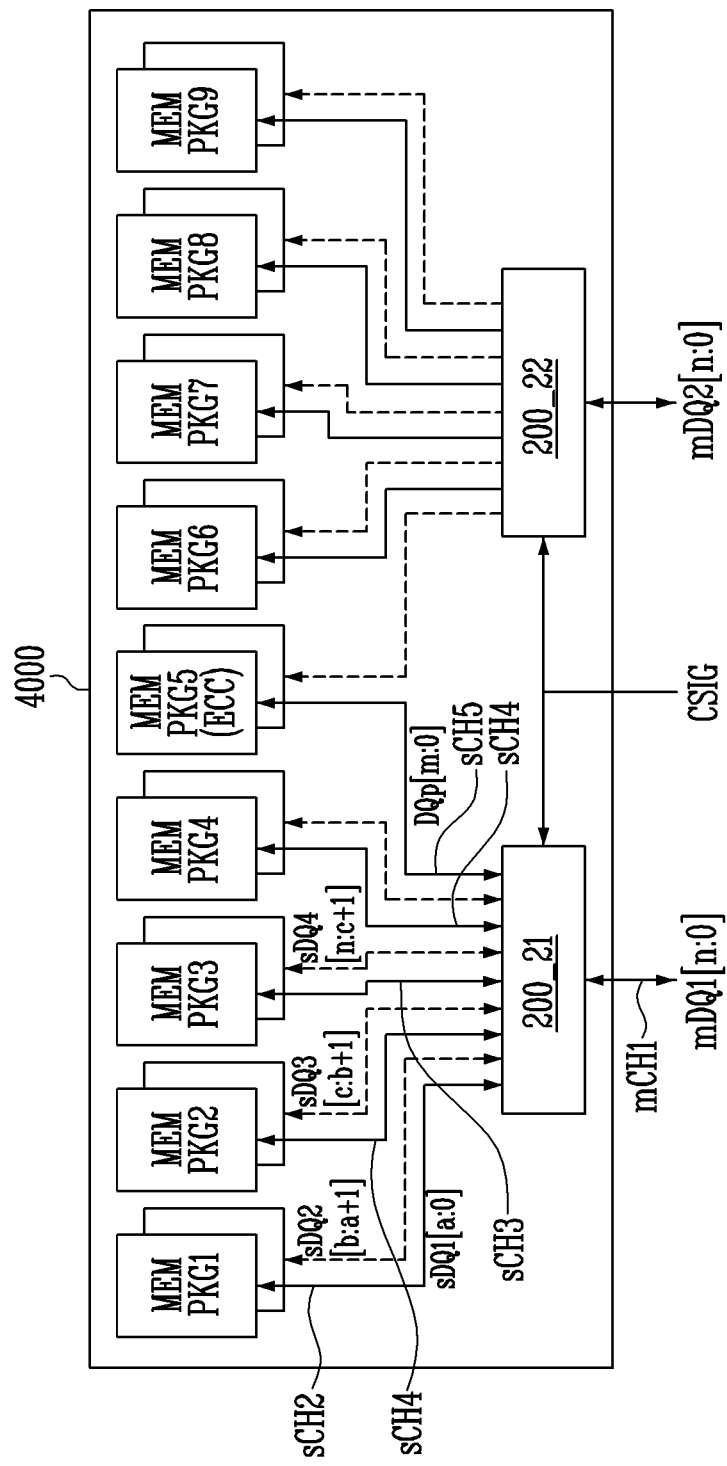

FIGS. 8 and 9 are diagrams illustrating memory systems in accordance with other embodiments of the present disclosure.

Referring to FIG. 8, a memory system 3000 may include a plurality of sub-controllers 200_11 to 200_14, a control signal transmission circuit CST, and a plurality of memory packages MEM PKG1 to MEM PKG10, which are implemented on one printed circuit board (PCB). For example, each of eleventh to fourteenth sub-controllers 200_11 to 200_14 may be configured identically to the sub-controller 200 or 200_1 described in FIG. 2 or 7. Each of first to tenth memory packages MEM PKG1 to MEM PKG10 may be configured as a package including a plurality of memory devices (300 shown in FIG. 1) connected to different sub-channels. For example, the first memory package MEM PKG1 may include memory devices connected to different sub-channels, and the second memory package MEM PKG2 may include memory devices connected to different sub-channels. The control signal transmission circuit CST may be configured to transmit control signals CSIG output from a main controller to the eleventh to fourteenth sub-controllers 200_11 to 200_14. The control signals CSIG may include a command for controlling the plurality of memory packages MEM PKG1 to MEM PKG10, and the like.

When an error correction circuit (ECC shown in FIG. 7) is included in the eleventh to fourteenth sub-controllers 200_11 to 200_14, some memory packages among the first to tenth memory packages MEM PKG1 to MEM PKG10 may be used to store parity data DQp[m:0], and the other packages among the first to tenth memory packages MEM PKG1 to MEM PKG10 may be used to store sub-data.

The eleventh sub-controller 200_11 among the eleventh to fourteenth sub-controller 200_11 to 200_14 will be described as an example.

The eleventh sub-controller 200_11 may be configured to communicate with the main controller through a first main channel mCH1. For example, the eleventh sub-controller 200_11 may receive or output first main data mDQ1[$n$:0] through the first main channel mCH1. The first to third memory packages MEM PKG1 to MEM PKG3 may be connected to the eleventh sub-controller 200_11, and the parity data DQp[m:0] may be stored in the third memory package MEM PKG3 among the first to third memory packages MEM PKG1 to MEM PKG3.

The eleventh sub-controller 200_11 may transmit/receive first main data mDQ1[$n$:0] through the first main channel mCH1, transmit/receive first sub-data sDQ1[$p$:0] through a first sub-channel sCH1, transmit/receive second sub-data sDQ2[$n{:}p$+1] through a second sub-channel sCH2, and transmit/receive parity data DQp[m:0] through a third sub-channel sCH3.

When parity data DQ[m:0] about the first and second sub-data sDQ1[$p{:}0$] and sDQ2[$n{:}p$+1] is stored in a first memory device among memory devices included in the third memory package MEM PKG3, another parity data output from the twelfth sub-controller 200_12 may be stored in another memory device included in the third memory package MEM PKG3. The first and second sub-data sDQ1[$p{:}0$] and sDQ2[$n{:}p$+1] is not a group in which bits of the first main data mDQ1[$n{:}0$] are divided into odd and even numbers, but may be data in which sequentially input bits are divided in ½.

Referring to FIG. 9, a memory system 4000 may include a plurality of sub-controllers 200_21 and 200_22 and a plurality of memory packages MEM PKG1 to MEM PKG9, which are implemented on one printed circuit board (PCB). In the memory system 4000 shown in FIG. 9, the control signal transmission circuit CST shown in FIG. 8 may be omitted. Therefore, control signals CSIG output from the main controller may be directly applied to twenty-first and twenty-second sub-controllers 200_21 and 200_22.

In the memory system 4000 shown in FIG. 9, five memory packages, e.g., first to fifth memory packages MEM PKG1 to MEM PKG5 are connected to the twenty-first sub-controller 200_21, and the fifth memory package MEM PKG5 among the first to fifth memory packages MEM PKG1 to MEM PKG5 is set to store the parity data DQp[m:0]. Therefore, the first main data mDQ[n:0] may be distributed and stored in the first to fourth memory packages MEM PKG1 to MEM PKG4. For example, each of first to fourth sub-data sDQ1[$a{:}0$], sDQ1[$b{:}a$+1], sDQ1[$c{:}b$+1], and sDQ1[$n{:}c$+1] may be configured with bits obtained by dividing the first main data mDQ[n:0] in ¼.

FIGS. 10 to 13 are diagrams illustrating a package including a sub-controller in accordance with an embodiment of the present disclosure.

Referring to FIGS. 10 to 13, the sub-controller 200 in accordance with the present disclosure along with a plurality of memory devices MEM11 to MEM22 may constitute one package.

Figure 10:
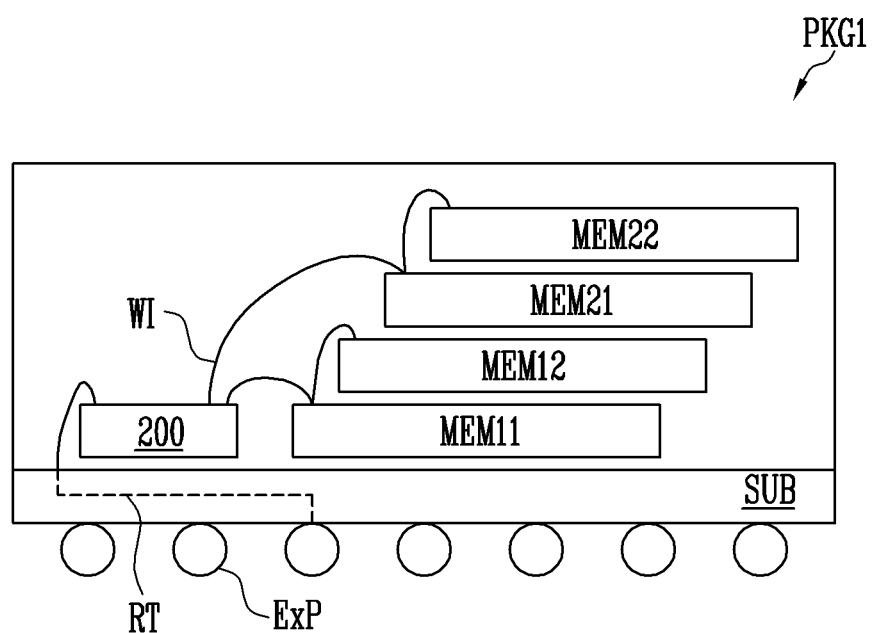
FIGS. 10 to 13 are diagrams illustrating a package including a sub-controller in accordance with an embodiment of the present disclosure.

Referring to FIG. 10, a first package PKG1 is a package having a side-by-side structure, and may be frequently used when the number of the memory devices MEM11 to MEM22 included in the package is small. For example, the sub-controller 200 and the plurality of memory devices MEM11 to MEM22 may be stacked on a substrate SUB. The sub-controller 200 may communicate with the plurality of memory devices MEM11 to MEM22 through wires WI, and communicate with an external device through a routing RT and external connection pads ExP. The external device may be the main controller (100 shown in FIG. 1).

Figure 11:
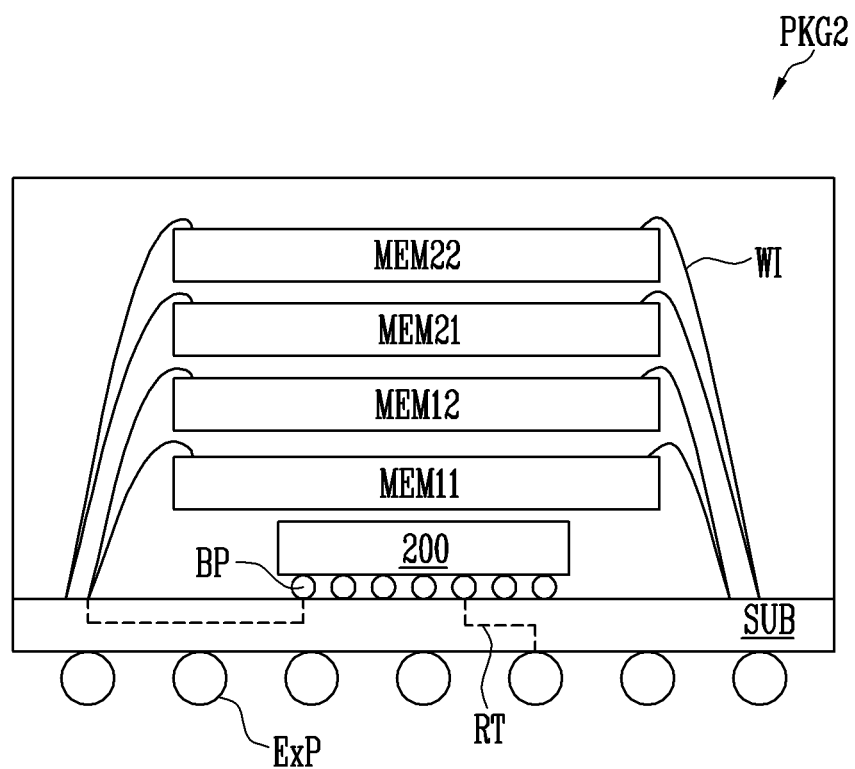

Referring to FIG. 11, a second package PKG2 may include a sub-controller 200 and a plurality of memory devices MEM11 to MEM22, which are stacked on a substrate SUB. The sub-controller 200 may communicate with the plurality of memory devices MEM11 to MEM22 through bonding pads BP and wires WI, and communicate with an external device through a routing RT and external connection pads ExP.

Figure 12:
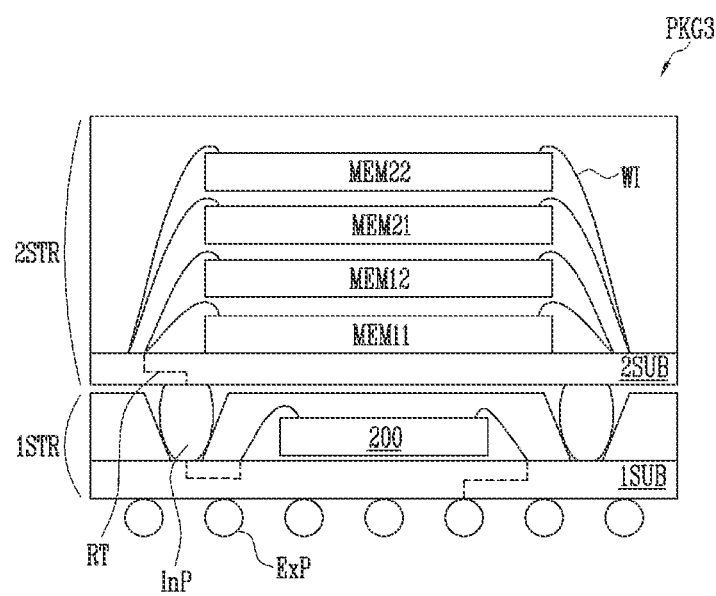

Referring to FIG. 12, a third package PKG3 may include first and second stacked structures 1STR and 2STR, which are stacked with each other. The first stacked structure 1STR may include a sub-controller 200 formed on a first substrate 1SUB. The second stacked structure 2STR may include a second substrate 2SUB stacked on the first stacked structure 1STR and a plurality of memory devices MEM11 to MEM22 stacked on the second substrate 2SUB. The first and second stacked structures 1STR and 2STR may be configured to communicate with each other through internal connection pads InP, and the sub-controller 200 may communicate with the plurality of memory devices MEM11 to MEM22 through a routing RT, the internal connection pads InP, and wires WI.

Figure 13:
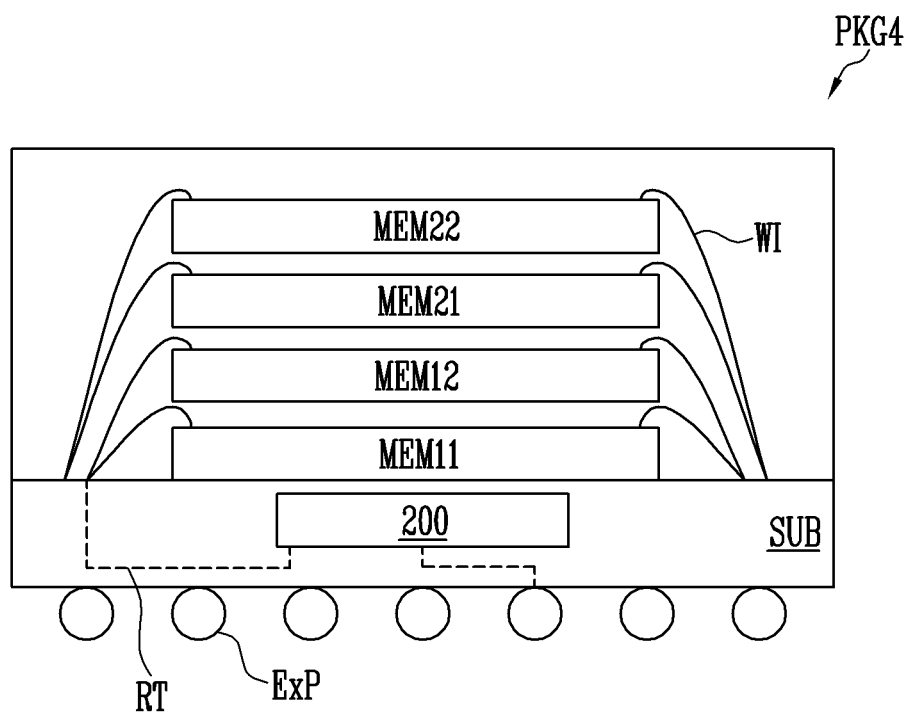

Referring to FIG. 13, a fourth package PKG4 may include a sub-controller 200 formed in a substrate SUB and a plurality of memory devices MEM11 to MEM22 stacked on the substrate SUB. The sub-controller 200 may communicate with an external device through a routing RT and external connection pads ExP, and communicate with the plurality of memory devices MEM11 to MEM22 through the routing RT and wires WI.

In accordance with the present disclosure, large-capacity data can be programmed or read at high speed without signal distortion, and thus the reliability of the memory system which processes data can be improved.

Various embodiments of the present disclosure have been described in the drawings and specification. Although specific terminologies are used here, those are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

So far as not being differently defined, all terms used herein including technical or scientific terminologies have meanings that are commonly understood by those skilled in the art to which the present disclosure pertains. The terms having the definitions as defined in the dictionary should be understood such that they have meanings consistent with the context of the related technique. So far as not being clearly defined in this application, terms should not be understood in an ideally or excessively formal way.

Although a memory system and an operating method thereof have been described with reference to the specific embodiments, these are merely examples, and the present disclosure is not limited thereto, and should be interpreted to have the widest scope according to the basic idea disclosed in the present specification. Those skilled in the art may carry out unspecified embodiments by combining and substituting the disclosed embodiments, but these also do not depart from the scope of the present disclosure. In addition, those skilled in the art may easily change or modify the embodiments disclosed based on the present specification, and it is apparent that such changes or modifications also fall within the scope of the present disclosure and the following claims. Furthermore, the embodiments may be combined to form additional embodiments.

What is claimed is:

1. A memory system comprising:
   a main controller configured to transmit main data having N bits through a main channel, where N is a positive integer;
   memory devices configured to store sub-data constituting the main data and transmit the sub-data through sub-channels; and
   a sub-controller configured to communicate with the main controller through the main channel and communicate with the memory devices through the sub-channels, wherein the sub-controller is further configured to:
generate the sub-data each having n bits where n is a positive integer less than N, by dividing the main data,
generate sub-data strobe clocks with a lower frequency than a main data strobe clock synchronized with the main data, and
transmit/receive the sub-data to/from the memory devices in synchronization with the sub-data strobe clocks.

2. The memory system of claim 1, wherein each of the memory devices is one of a Random Access Memory (RAM), a Read Only Memory (ROM), a Dynamic RAM (DRAM), a Synchronous Dynamic RAM (SDRAM), a Ferromagnetic RAM (FeRAM), a Magnetic RAM (MRAM), a Resistive RAM (RRAM), a flash memory, and a Phase Change Memory (PCM).

3. The memory system of claim 1, wherein the sub-controller generates the sub-data by dividing the main data by a number of the sub-channels.

4. The memory system of claim 1, wherein the sub-controller generates the sub-data strobe clocks by dividing a frequency of the main data strobe clock by a number of the sub-channels such that each of the sub-data strobe clocks has the divided frequency.

5. The memory system of claim 1, wherein the sub-controller includes:
a main input/output circuit group configured to receive or output the main data and the main data strobe clock through the main channel;
a modulation circuit group configured to:
modulate the main data to the sub-data or modulate the sub-data to the main data, and
modulate the main data strobe clock to the sub-data strobe clocks or modulate the sub-data strobe clocks to the main data strobe clock; and
a sub-input/output circuit group configured to receive or output the sub-data and the sub-data strobe clocks through the sub-channels.

6. The memory system of claim 5, wherein the main input/output circuit group includes:
a first input driver configured to receive the main data output from the main controller and transmit the received main data to the modulation circuit group;
a first output driver configured to transmit the main data output from the modulation circuit group to the main controller;
a second input driver configured to receive the main data strobe clock output from the main controller and transmit the received main data strobe clock to the modulation circuit group; and
a second output driver configured to transmit the main data strobe clock output from the modulation circuit group to the main controller.

7. The memory system of claim 6, wherein the modulation circuit group includes:
a first modulation circuit configured to divide the main data output from the first input driver into the sub-data or merge the sub-data to transmit the merged sub-data as the main data to the first output driver; and
a second modulation circuit configured to modulate, to the sub-data strobe clocks, the main data strobe clock output from the second input driver or modulate, to the main strobe clock, the sub-data strobe clocks to transmit the main data strobe clock to the second output driver.

8. The memory system of claim 7, wherein the second modulation circuit modulates the main data strobe clock to the sub-data strobe clocks by decreasing a speed of the main data strobe clock output from the second input driver or modulates the sub-data strobe clock to the main data strobe clock by increasing a speed of the sub-data strobe clocks to transmit the main data strobe clock to the second output driver.

9. The memory system of claim 7, wherein the second modulation circuit modulates the main data strobe clock to the sub-data strobe clocks by decreasing a burst length of the main data strobe clock output from the second input driver or modulates the sub-data strobe clock to the main data strobe clock by increasing a burst length of the sub-data strobe clocks to transmit the main data strobe clock to the second output driver.

10. The memory system of claim 7, wherein the sub-input/output circuit group includes:
a third output driver configured to transmit first sub-data among the sub-data, which are divided from the main data by the first modulation circuit, to a first memory device among the memory devices through a first sub-channel included in the sub-channels;
a fourth output driver configured to transmit a first sub-data strobe clock among the sub-data strobe clocks, which are modulated from the main data strobe clock by the second modulation circuit, to the first memory device through the first sub-channel;
a fifth output driver configured to transmit second sub-data among the sub-data, which are divided from the main data by the first modulation circuit, to a second memory device among the memory devices, through a second sub-channel included in the sub-channels; and
a sixth output driver configured to transmit a second sub-data strobe clock among the sub-data strobe clocks, which are modulated from the main data strobe clock by the second modulation circuit, to the second memory device through the second sub-channel.

11. The memory system of claim 10, wherein the sub-input/output circuit group includes:
a third input driver configured to transmit, to the first modulation circuit, the first sub-data provided through the first sub-channel;
a fourth input driver configured to transmit, to the second modulation circuit, the first sub-data strobe clock provided through the first sub-channel;
a fifth input driver configured to transmit, to the first modulation circuit, the second sub-data provided through the second sub-channel; and
a sixth input driver configured to transmit, to the second modulation circuit, the second sub-data strobe clock provided through the second sub-channel.

12. The memory system of claim 5, further comprising a mode register configured to store mode information of the memory devices and provide the mode information to the modulation circuit group.

13. The memory system of claim 12, wherein the mode information includes information on whether the memory devices are double data rate (DDR) memory devices, low power DDR (LPDDR) memory devices, LPDDR3 memory devices, or LPDDR4 memory devices.

14. The memory system of claim 13, wherein the modulation circuit group modulates the main data, the sub-data, the main data strobe clock, and the sub-data strobe clocks to be suitable for standards of a clock, a data transmission speed, a bandwidth, and a voltage according to the mode information.

15. The memory system of claim 5, further comprising an error correction circuit connected between the modulation circuit group and the sub-input/output circuit group and configured to generate parity data for the sub-data and detect and correct an error of the sub-data by using the parity data.

16. The memory system of claim 15, further comprising a parity memory device configured to store the parity data.

17. The memory system of claim 16, wherein the parity memory device and the memory devices are connected to the sub-input/output circuit group through different sub-channels.

18. A method for operating a sub-controller, the method comprising:
    receiving main data in synchronization with a main data strobe clock;
    generating a sub-data strobe clock with a lower frequency than the main data strobe clock;
    dividing the main data to generate sub-data; and
    outputting the sub-data in synchronization with the sub-data strobe clock.

19. The method of claim 18, wherein the sub-data strobe clock is generated by decreasing a frequency of the main data strobe clock according to a number of sub-channels through which the sub-data are output.

20. The method of claim 18, wherein the main data is divided by a number of sub-channels, through which the sub-data are output, to generate the sub-data.

* * * * *